United States Patent [19]

de Keyser et al.

[11] 4,160,962

[45] Jul. 10, 1979

[54] DUAL SECTION DISTRIBUTED PARAMETER DELAY-LINE

[75] Inventors: Andre de Keyser, Ronse; Laurent Seynaeve, St. Eloois-Vijve, both of Belgium

[73] Assignee: Sprague Electric Company, North Adams, Mass.

[21] Appl. No.: 848,541

[22] Filed: Nov. 4, 1977

[51] Int. Cl.² .......................... H03H 7/30; H01P 1/18; H01P 9/00; H04N 9/535

[52] U.S. Cl. .................................... 333/141; 333/156; 336/181; 358/39

[58] Field of Search .......... 333/29, 31R, 31C; 29/602; 336/69, 211, 336/173, 180; 358/21, 36, 39, 40, 155, 167

[56] References Cited

U.S. PATENT DOCUMENTS

| | | | |
|---|---|---|---|
| 1,613,952 | 1/1927 | Johnson | 333/75 |
| 2,703,389 | 3/1955 | Schwartz, Jr. | 333/29 |
| 3,750,054 | 7/1973 | Tamura et al. | 333/31 X |
| 3,908,177 | 9/1975 | Kameya | 333/29 |

FOREIGN PATENT DOCUMENTS

| | | | |
|---|---|---|---|
| 1240599 | 5/1967 | Fed. Rep. of Germany. | |
| 733763 | 7/1955 | United Kingdom | 333/29 |

Primary Examiner—Alfred E. Smith
Assistant Examiner—Marvin Nussbaum
Attorney, Agent, or Firm—Connolly and Hutz

[57] ABSTRACT

A delay-line has two essentially identical distributed parameter delay-line sections that have series connected solenoidal coils and mutually parallel axes. The winding directions of the two coils are such that an external observer traveling along the series connected coils from one free coil-end to the other will observe a winding direction reversal in going from one section to the other. Thus a uniform unidirectional magnetic field having a component parallel to the section axes will produce induced voltages in the two coils that are of opposite polarity and no net induced voltage will appear between the free ends of the series connected coils.

6 Claims, 15 Drawing Figures

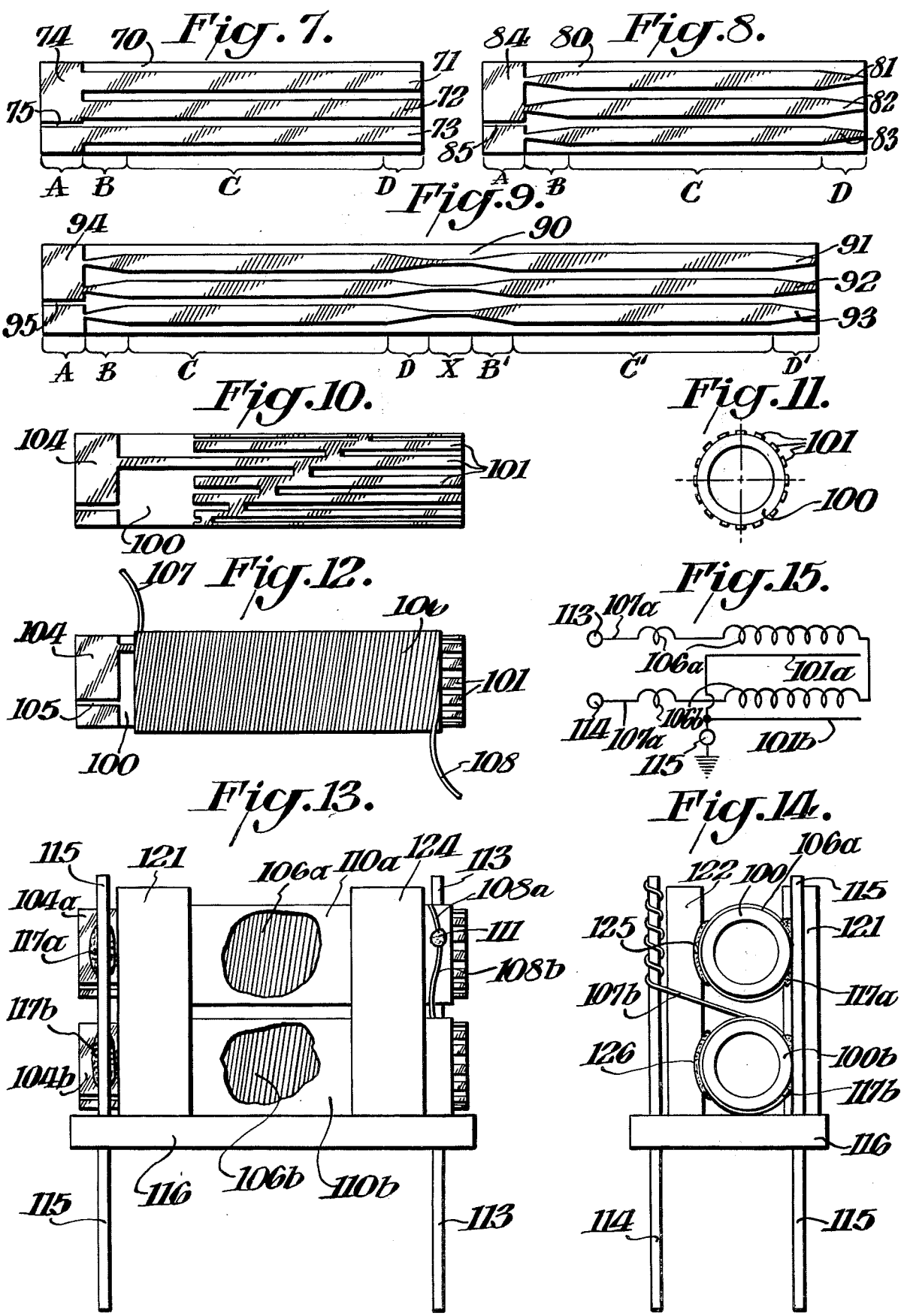

DUAL SECTION DISTRIBUTED PARAMETER DELAY-LINE

BACKGROUND OF THE INVENTION

This invention relates to an electromagnetic delay line for delaying the luminance signal in a color television receiver and more particularly to a dual section distributed parameter delay line.

In color television receiver circuitry, the luminance portion of the picture signal must be delayed typically by a little less than a microsecond so that it arrives at the picture tube simultaneously with the chrominance signal. A great variety of lumped-parameter and of distributed parameter delay lines have been used for this purpose.

However, in recent years certain changes and improvements have been made in other portions of TV receivers which generate relatively large magnetic fields within the receiver. For example, switching-mode high voltage power supplies have been introduced to reduce power consumption. The output transformer in these power supplies radiate electromagnetic energy at a fundamental frequency as high as 35 KHz.

Another source of stray magnetic fields within color TV receivers is the deflection coil. There is a trend toward the use of so-called precision-in-line (P.I.L.) picture tubes which call for toroidal deflection yokes in place of the saddle type yokes used earlier. Experience has shown that the toroidal yokes generate stronger stray fields. These signals usually have a fundamental frequency of approximately 15 KHz.

Manufacturers of these modern color TV receivers have found that the large stray fields induce unwanted noise voltages into the delay-line. Among other adverse effects on the performance of the receiver, the black level is seriously altered, the relative position of the delay-line within the receiver is critical which complicates initial tune-up and field adjustments, and visible disturbances of the picture occur.

Several manufacturers have begun to use shielded delay-lines. The shield usually consists of two halves of a ferro-magnetic material placed around the delay-line, the halves being connected together and to a ground point in the receiver. Besides the additional costs, such shielded delay-lines are substantially larger and heavier than their non-shielded counterparts.

It is an object of the present invention to provide an improved delay line that overcomes the above noted problem.

SUMMARY OF THE INVENTION

An electromagnetic delay-line for delaying the luminance signal in a color television receiver has precisely two essentially identical distributed parameter delay line sections. Each section is comprised of an elongated mandrel of uniform cross section such as a cylinder. A continuous wire coil is wound about the mandrel. The mandrel of each section has a conductive surface that serves as the ground plane of the section. The uniformly wound coil is insulated from the ground plane and thus has a continuously distributed capacity to the ground plane in an axial direction.

The ground planes of the mandrels of the two sections are electrically interconnected and a coil end of each of the sections are also interconnected. The axes of the two mandrels are mutually parallel, and the winding direction of one of the coils being opposite to that of the other in the sense that an observer traveling along the interconnected coils will observe a winding reversal in going from one to the other of the two sections. Thus a uniform unidirectional magnetic field of slowly varying magnitude having flux lines parallel to the mandrel axes will produce no net voltage between the free ends of the interconnected coils.

Thus the low frequency components of a magnetic field will produce essentially no noise voltages at the input or output of a dual section delay-line of this invention. Further a metal shield having a magnetic permeability near unity may be placed about the delay-line to effectively prevent high frequency components of the magnetic field environment from producing noise in the delay-line, and the minimum spacing between such a non-magnetic shield and the dual sections may be as close to the sections as 0.15 times the diameter of the coils without substantial degradation of the delay-line bandwidth.

BRIEF DESCRIPTION OF THE DRAWING

FIGS. 7, 8 and 9 show three cylindrical delay-line mandrels of this invention, each having been slit along its length and flattened to show the full pattern of the conductive "ground plane" coating on the cylindrical surface of the mandrel.

FIG. 10 shows in side view yet another mandrel of this invention.

FIG. 11 shows in right-end view the mandrel of FIG. 10.

FIG. 12 shows in side view a distributed parameter delay-line section of this invention having been formed on the mandrel of FIGS. 10 and 11.

FIG. 13 shows in side view a delay-line of this invention comprising two sections of the type shown in FIG. 12.

FIG. 14 shows in left-end view the delay-line of FIG. 13.

FIG. 15 shows a schematic diagram of the delay-line of FIG. 13.

DESCRIPTION OF THE PREFERRED EMBODIMENTS

Figure 1:
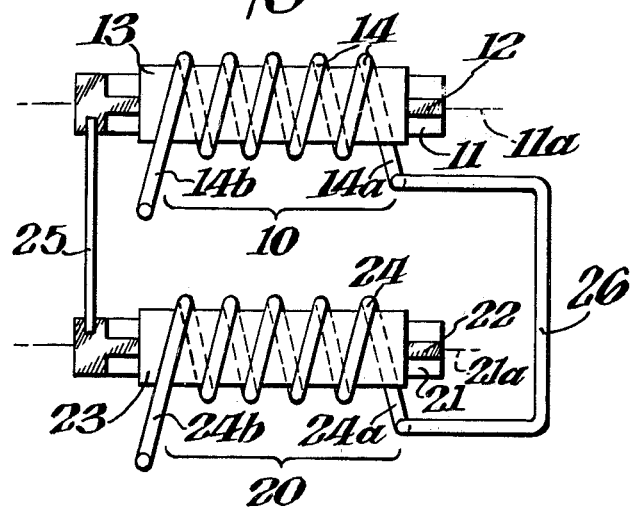
FIG. 1 shows a delay-line of this invention having two distributed parameter delay-line sections positioned side by side, the two continuously wound coils of which have the same clockwise winding directions.

There is represented in FIG. 1 a first preferred embodiment of the invention. Two identical distributed parameter delay-line sections, 10 and 20, each have an elongated insulative mandrel (11 and 21), a conductive coating (12 and 22) on the surface of the mandrel, an insulative film (13 and 23) overlying the conductive coating, and a continuous wire coil (14 and 24) wound about the mandrel over the insulative film.

The conductive coatings 12 and 22 are electrically interconnected by a wire 25 and serve as the "ground plane" of the delay-line. One free end 14a of coil 14 is connected by a wire 26 to one free end 24a of coil 24 so that the coils form a series circuit. Every turn of the wound coil 14 (or 24) has the same spacing from and the same capacity with respect to the underlying coating 12 (or 22). The mandrels 11 and 21 are preferably circular cylinders but may have other elongated forms with uniform cross sectional areas such as flat plates.

The axis 21a of mandrel 21 is parallel to axis 11a of mandrel 11, and the mandrels are positioned side by side but being spaced apart so as to minimize reflections that are generated near the interconnection between the two coils. Typically this requires a coil separation of about one fifth of a coil diameter, depending however upon numerous structural features such as the type, the aspect ratio of the coil, the winding pattern, the pattern of the conductive coating and the shape and material of the mandrel. Optimum spacing between sections is best determined empirically to achieve proper balance between a small delay-line package with small spacing and a wanted degree of positive mutual inductive coupling which has been found to compensate for an otherwise reduced $L/C$ ratio of the coil portions near the interconnection therebetween.

Figure 2:
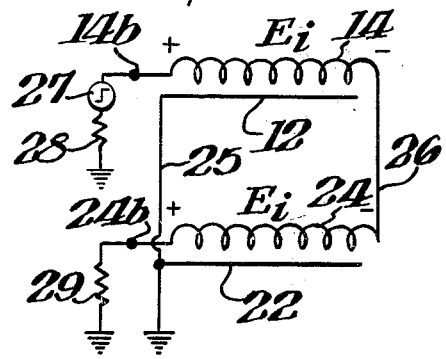
FIG. 2 shows a schematic diagram of the delay-line of FIG. 1 being connected to a signal source and to a load.

In the schematic diagram of FIG. 2, the other free end 14b of coil 14 is considered to be the input terminal of the delay-line and the other free end 24b of coil 24 is then the output terminal. An ideal voltage source 27 having a series source resistor 28 is shown connected between the input 14b and the ground plane. A load resistor 29 is connected across the output of the delay line from terminal 24b and the ground plane. These resistors are usually each chosen to have a resistance value equal to the characteristic impedance of the delay line so that a signal traveling in either direction along the delay line will be completely dissipated in one or the other of these resistors and thus will not be reflected back into the delay-line causing distortions in other portions of the signals there. Thus in normal operation a signal produced by voltage source 27 will travel through the delay-line and arrive across the load resistor 29 some fixed time later, namely $T_1+T_2=2T_1$ later where $T_1$ and $T_2$ are the characteristic delay times of the identical sections 10 and 20, respectively.

Note that relative to one axial direction the winding directions of the two parallel coils 14 and 24 are in the same clockwise direction. When a uniform unidirectional magnetic field of varying amplitude is present, a voltage $E_i$ may be induced at a given instant of time across coil 10 in the polarity indicated in FIG. 2. Since the winding sense of the coils is the same, the same induced voltage $E_i$ will appear across coil 20 in the polarity that is opposing the voltage induced in the series connected coil 10 and no voltage appears across the delay-line.

The above explanation of the magnetic field noise rejection feature of this embodiment must be tempered by the fact that it takes a finite time for a signal induced at any given point within the delay-line to travel to the source or to the load. Thus if the induced voltage has components of frequency ($H_z$) less than about 0.06 times the reciprocal of the delay time (in seconds) of the delay-line, then essentially no induced noise voltage will appear at either the input or the output of the delay-line. Typical delay-times for a color TV delay-line ranges between 0.25 to 1 microseconds and such delay-lines made according to this invention will effectively reject induced noise voltages having components less than 60 KHz.

Figure 3:
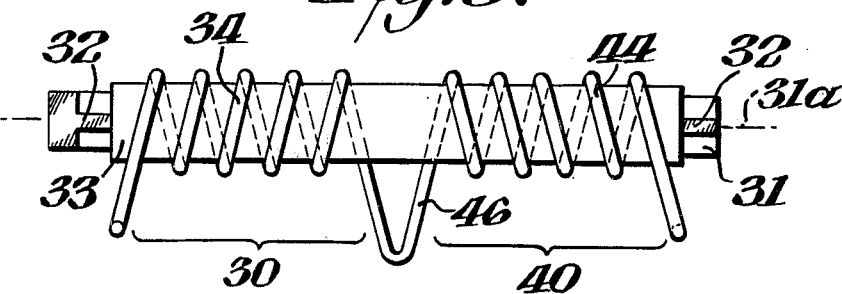
FIG. 3 shows another delay-line of this invention having two distributed parameter delay-line sections positioned end to end, the two continuously wound coils of which have opposite clockwise winding directions.

There is represented in FIG. 3 a second preferred embodiment of the invention. Two identical distributed parameter delay-line sections 30 and 40 are formed on an elongated insulative mandrel 31, a conductive coating 32 on the surface of the mandrel, an insulative film 33 overlying the conductive coating, and each section having a continuous wire coil (34 and 44) wound about the mandrel over the insulative film. The two sections thus have the same axis 31a or may be considered to have congruent axes. As is the case in the above described first embodiment, the two coils are connected in series by wire link 46, but unlike the first embodiment the coils are wound in opposite clockwise directions, respectively, relative to one axial direction.

It is preferred that a space be provided between the adjacent and interconnected ends of the two coils because otherwise the inductance per turn (inductance per unit length of coil) will be greatly diminished near these ends due to the negative mutual inductive coupling between the oppositely wound coils. The characteristic impedance ($Z_o$) of any segment of an electromagnetic delay line is equal to the square root of the ratio of the segment inductance to the segment capacitance (to ground plane), and thus if a small or no space is provided between the ends of the coils, a substantial discontinuity is observed in $Z_o$ at that junction. Such a discontinuity will cause unwanted signal distortion. As will be seen below, however, the adjacent coil ends may be made quite close in practice because it is possible to compensate in this junction region to maintain a substantially constant $Z_o$ throughout the delay line.

Figure 4:
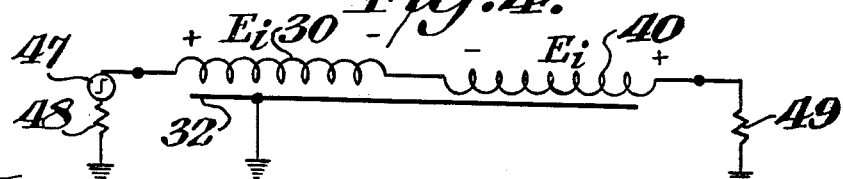
FIG. 4 shows a schematic diagram of the delay-line of FIG. 3 being connected to a signal source and to a load.

The dual section delay line of FIG. 3 is shown schematically in FIG. 4. An ideal signal voltage source 47 is shown in series with an associated source resistor 48, and this series combination is connected to the input of the delay line. A load resistor 49 is connected to the output of the delay line. Equal amplitude induced voltages $E_i$ are shown appearing across each of the two coils, resulting from a stray magnetic field as was described above. These voltages are opposed in the series connected coils and no voltage appears across the delay line.

It was indicated above that a delay-line of this invention having a delay time of 1.0 microseconds will effectively suppress low frequency noise of the kind generated in modern TV sets having switching type power supplies and P.I.L. (precision-in-line) picture tubes. However, when the noise inducing stray magnetic field has frequency components whose period approaches or is less than the delay time of this dual section delay-line, noise voltages may appear at the input and the output.

This may be understood by considering a stray magnetic field "ramp pulse" that is to say a field whose strength abruptly changes from zero to one increasing at a constant rate. Such a field pulse will induce a step of voltage in each winding-turn. Each induced step will be delayed a different time before reaching either end of the delay line. The effect, as seen for example at the output, will be the creation of a noise pulse having a staircase rise and then fall roughly approximating a triangle the base of which is about equal to the total delay time of the delay-line.

In some TV receiver systems the high frequency noise pulses do not have an objectionable effect on the performance, the low frequency magnetic field induced noise being suppressed by the dual section delay-line.

However in receiver systems where the high frequency noise does cause deterioration in system performance, it is rather easily suppressed by providing a simple sheet metal shield about a major portion of the dual section line. Furthermore such a conducting shield may be made of a thin (e.g. 0.15 to 0.5 mm) non-ferrous metal such as aluminum or copper which may in practice lie as close as about 0.15 times the outer diameter of the coils without substantial effect on the signal transfer characteristics of the delay-line. In contrast, prior art ferromagnetic shields must be spaced about one coil diameter from the delay-line sections to avoid disadvantageously decreasing the bandwidth of the enclosed delay-line. The minimum spacing between the shield and the coils of this invention is preferably no greater than about 0.6 times the outer diameter of a coil to provide a small efficient delay-line package.

Figure 5:
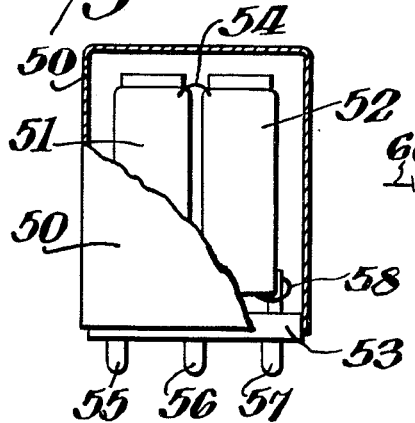
FIG. 5 shows a packaged delay-line of this invention with an outer package portion broken away to reveal the two delay-line sections.

A dual section delay-line of the type described above with reference to FIG. 1 is shown in a package in FIG. 5 having a high frequency aluminum shield 50. Two distributed parameter delay-line sections 51 and 52 are mounted side by side to an insulative base 53. The laterally adjacent coil ends of sections 51 and 52 are electrically interconnected by wire link 54. Connector pins 55, 56, and 57 each extend through base 53 serving as external terminals of the delay-line package. The free coil end of section 51 (not shown) is connected to pin 55. The ground planes (not shown) of the two mandrels are connected to "ground" pin 56, and the free coil end 58 of section 52 is connected to pin 57.

Figure 6:
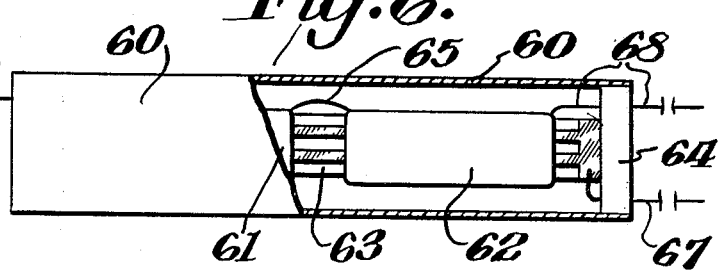
FIG. 6 shows another packaged delay-line of this invention with an outer package portion broken away to reveal the two delay-line sections.

A delay-line of the type illustrated in FIG. 3 is shown in a package in FIG. 6 having a tubular metal shield 60. Two distributed sections 61 and 62 are formed on a common cylindrical mandrel 63. The mandrel is mounted coaxially between two insulative discs (only disc 64 being seen at the right side of the figure). This mandrel-discs' assembly is enclosed within metal shield 60. The adjacent of the section coil ends are interconnected by wire link 65. The free or outer coil end 66 of section 61 extends through the (unseen) left hand disc; the conductive coating or ground plane of the mandrel is connected by a wire lead 67 which lead extends through disc 64; and the free or outer coil end 68 of section 62 extends through disc 64; the extending wires 66, 67, and 68 serving as the external terminals of the delay-line package.

The conductive "ground plane" pattern on the surface of mandrel 70 shown in FIG. 7 is typical of those employed in distributed delay-lines of the prior art and is suitable for certain delay-lines of this invention, particularly those having continuously wound coils with broadly spaced turns as illustrated in FIG. 1. This pattern consists of uniformly wide strips 71, 72 and 73 running in an axial direction and being connected by a ring termination portion 74 that may have a slot 75 therein.

However, for close wound single or multiple layer coils, the incremental inductance (inductance per unit length in an axial direction) is significantly smaller near the ends of the coil than in the middle regions. The ground plane pattern in FIG. 7 leads to an incremental coil to ground plane capacitance that is essentially the same at every segment along the coil. Consequently the ratio of incremental inductance to incremental capacitance decreases near the ends of the coil causing a reduced incremental characteristic impedance there. This, as has been noted above causes distortion of signals passing through the delay line, being particularly objectionable at the series interconnection region of the dual section delay line of this invention.

The surface of mandrel 80 in FIG. 8 also has a ground plane pattern consisting of axially running strips 81, 82 and 83 being connected by a ring portion 84. Slots 75 and 85 avoid any shorted turn transformer effect in relation to a coil having an end very close to either of the rings 74 and 84, respectively.

Four axially directed regions A, B, C and D of the mandrels of FIGS. 7 and 8 are indicated under the figures. Region A corresponds to the ground plane termination region. Regions B, C and D are to support a coil of a delay line section. The modified ground plane pattern of FIG. 8 is seen to have a progressively smaller conductive surface area toward the two coil ends (namely in regions B and D) than in the central coil region C. In this manner the characteristic impedance of every segment of the delay-line section may be the same value and distortion due to diminishing inductance per unit length at the end of a coil may be effectively eliminated.

This coil-end effect is compounded at two adjacent coil ends of two coaxial end-to-end coil sections of this invention. This occurs because the two coils have winding directions that result in a negative mutual inductance, especially between these adjacent coil ends, which further diminishes the effective incremental L/C ratio there. When wound on a common mandrel 90 such as that illustrated in FIG. 9, the axially running conductive ground plane strips 91, 92 and 93 may be tapered in a central region X to a substantially more narrow width to compensate the diminished inductance near the adjacent coil ends and produce a substantially uniform $Z_o$ along the entire delay line.

More specifically the first section coil would span regions B, C and D in the same manner as described for the mandrel of FIG. 8. The second section coil would span regions B', C' and D' and contact to the common ground plane would be obtained at the ring 94 in region A.

Another preferred embodiment of this invention is illustrated in the FIGS. 10 through 14. The mandrel 100 is a glass tube having an outer diameter of 5 mm and a length of 21 mm. The silver metallized ring 104 has an axial length of 2 mm and a spacing from fifteen of the sixteen metallized strips 101 of 4 mm. The strips 101 are 15 mm long and have a width of 0.4 mm. The spacing between the adjacent of the strips is 0.5 mm.

A compound multilayer progressive wound coil 106 consists of 500 turns of double coated polyurethane copper wire which wire has a diameter of 0.06 mm. The coil has an axial length of 17 mm and start and finish wire ends, 107 and 108, respectively.

Two delay line sections of the kind shown in FIG. 12 are employed in the dual section delay line of FIG. 13. The corresponding structural elements of the second section are assigned the same numeral designations as in the first section, a lower case "a" and "b" being added to numeral designations of the first and second sections, respectively. Insulative sheets 110a and 110b may be wrapped about the coils. Coil ends 108a and 108b are connected by solder joint 111.

Three terminal wires 113, 114 and 115 are mounted in an insulative base plate 116. Coil ends 107a and 107b are solder connected to wires 113 and 114, respectively, while the ground plane terminal rings 104a and 104b are connected by solder joints 117a and 117b, respectively. Insulative mounting blocks 121, 122, (123 not shown) and 124 assist in the physical mounting of the two sections (e.g. by glue bonds 125 and 126) to the base plate 116. The space between the two coils is 0.5 mm, as seen in FIG. 13.

The above described delay line of FIG. 13 was built and found to have a delay time of 470 nanoseconds and a characteristic impedance of 1800 ohms. The noise voltage generated by a 15 KHz magnetic field was attenuated more than 25 db over that obtained by a delay line employing the same two sections that were rearranged to be coaxial whereby the two interconnected coils had the same winding directions as would be seen by an observer proceeding from one coil to the other.

What is claimed is:

1. An electromagnetic delay-line for delaying the luminance signal in a color television receiver is comprised of exactly two essentially identical delay-line sections, each of said sections comprising an elongated mandrel with surface portions thereof being electrically conductive and a continuous wire coil being wound about and being insulated from said mandrel, said conductive surface portions of said two mandrels being electrically interconnected, said mandrels having parallel axes and being positioned side by side, a coil end of one and a coil end of the other of said sections being electrically interconnected, said interconnected coil ends being two laterally adjacent ends and the winding direction of one of said coils being the same as that of the other with respect to one axial direction so that a uniform unidirectional magnetic field of slowly varying magnitude having flux lines parallel to said axes will produce no net voltage between the free ends of said interconnected coils.

2. The delay-line of claim 1 wherein the body of said mandrel is of an insulative material, said conductive surface portions thereof being a metal film having a pattern consisting of an open ring that is circumferential to said mandrel at one end thereof and a plurality of elongated strips being parallel to said axes and being connected to said ring, said coil being wound over said strips.

3. The delay-line of claim 2 wherein the area per incremental unit length in an axial direction of said pattern is less near at least one of said mandrel than in a central region between said one end and the other end of said mandrel.

4. The delay-line of claim 1 additionally comprising a metal shield having a magnetic permeability near unity, said shield being positioned about said two sections.

5. The delay-line of claim 4 wherein said shield has a minimum spacing from said sections that is from 0.15 to 0.6 times the outside diameter of one of said coils.

6. The delay-line of claim 4 wherein said metal is selected from copper and aluminum.

* * * * *

UNITED STATES PATENT OFFICE
CERTIFICATE OF CORRECTION

Patent No. 4,160,962          Dated July 10, 1979

Inventor(s) Andre de Keyser et al

It is certified that error appears in the above-identified patent and that said Letters Patent are hereby corrected as shown below:

Claim 3, line 3, (Column 8, line 20) after "one" there should appear the word -- end --

Signed and Sealed this

Sixteenth Day of October 1979

[SEAL]

Attest:

RUTH C. MASON
Attesting Officer

LUTRELLE F. PARKER
Acting Commissioner of Patents and Trademarks